US010234501B2

(12) United States Patent
Mende et al.

(10) Patent No.: US 10,234,501 B2
(45) Date of Patent: Mar. 19, 2019

(54) ACTIVE NOISE SUPPRESSION FOR OPTICAL VOLTAGE SENSOR

(71) Applicant: Tektronix, Inc., Beaverton, OR (US)

(72) Inventors: Michael J. Mende, Portland, OR (US); Richard A. Booman, Lake Oswego, OR (US)

(73) Assignee: Tektronix, Inc., Beaverton, OR (US)

( * ) Notice: Subject to any disclaimer, the term of this patent is extended or adjusted under 35 U.S.C. 154(b) by 5 days.

(21) Appl. No.: 15/268,184

(22) Filed: Sep. 16, 2016

(65) Prior Publication Data

US 2017/0248653 A1 Aug. 31, 2017

Related U.S. Application Data

(60) Provisional application No. 62/300,659, filed on Feb. 26, 2016.

(51) Int. Cl.
*G01R 31/308* (2006.01)
*G01R 15/22* (2006.01)
(Continued)

(52) U.S. Cl.
CPC .......... *G01R 31/308* (2013.01); *G01R 15/22* (2013.01); *G01R 15/241* (2013.01);
(Continued)

(58) Field of Classification Search
CPC ...... G02B 27/0012; G02B 2006/12147; G02B 2006/12159; G02B 6/2726; G02B 6/278; G02B 6/2932; G02B 6/2935; G02B 6/29352; G02B 6/29397; G02B 6/4274; G02B 2006/12038; G02B 6/2813; G02B 6/29344; G02B 6/2773; G02B 6/2861; G02B 6/29349; G02B 6/29395; G02B 6/2713; G02B 6/272; G02B 6/2821; G02B 6/29302; G02B 6/29338; G02B 6/35; G02B 17/5077; H01S 3/005; H01S 5/06804; H01S 5/02252; H01S 5/00; H01S 5/147; H01S 5/0014; G01R 1/071; G01R 35/005; G01R 13/0281; G01R 15/24; G01R 1/06766; G01R 27/28; G01R 31/00; G01R 31/308; G01R 31/311; G01R 31/3191; G01R 35/00; G01R 15/22; G01R 19/00; G01R 27/32; G01R 29/0885; G01R 29/12;
(Continued)

(56) References Cited

U.S. PATENT DOCUMENTS 9,476,960 B2 * 10/2016 Mende .............. G01R 31/3191
2003/0174337 A1 * 9/2003 VanWiggeren ...... G01M 11/331
356/477

(Continued)

*Primary Examiner* — Vinh Nguyen
(74) *Attorney, Agent, or Firm* — Miller Nash Graham & Dunn; Kevin D. Dothager

(57) ABSTRACT

A sensor head of a test and measurement instrument can include an input configured to receive an input signal from a device under test (DUT), an optical voltage sensor having signal input electrodes and control electrodes or one set of electrodes, wherein the input is connected to the signal input electrodes, and a bias control unit connected to the control electrodes and configured to reduce an error signal or the input signal bias control signal are electrically combined and applied to a single set of electrodes.

15 Claims, 4 Drawing Sheets

(51) Int. Cl.
*G01R 19/00* (2006.01)
*G01R 15/24* (2006.01)
*G01R 1/07* (2006.01)
*G02F 1/01* (2006.01)

(52) U.S. Cl.
CPC ....... *G01R 15/247* (2013.01); *G01R 19/0084* (2013.01); *G01R 1/071* (2013.01); *G02F 1/0123* (2013.01)

(58) Field of Classification Search
CPC ................ G01R 15/241; G01R 15/247; G01R 19/0084; G01R 1/06772; G01R 29/26; G01R 31/2824; G02F 1/225; G02F 2001/212; G02F 1/2255; G02F 1/011; G02F 1/0123; G02F 1/025; G02F 1/035; G02F 1/09; G02F 1/2257; G02F 2001/0151; G02F 2001/0155; G06F 17/5077; G01B 15/00; G01N 21/21; G01N 23/20
See application file for complete search history.

(56) References Cited

U.S. PATENT DOCUMENTS

2007/0002328 A1* 1/2007 Woods ................. G01R 31/308
356/489
2009/0304379 A1* 12/2009 Hashimoto .......... H04B 10/508
398/16

* cited by examiner

ACTIVE NOISE SUPPRESSION FOR OPTICAL VOLTAGE SENSOR

CROSS-REFERENCE TO RELATED APPLICATION

This application claims the benefit of U.S. Provisional Patent Application No. 62/300,659, entitled "ACTIVE NOISE SUPPRESSION FOR OPTICAL VOLTAGE SENSOR" and filed on Feb. 26, 2016, the disclosure of which is hereby fully incorporated by reference herein.

TECHNICAL FIELD

This disclosure relates generally to test and measurement instruments and more particularly to measuring small differential, high bandwidth signals in the presence of large common mode voltages.

BACKGROUND OF THE INVENTION

Optical voltage sensors have superior alternating current (AC) electrical performance and are inherently electrically isolated. The majority of them have been used by the communication industry to couple digital signals into the vast fiber optic networks. These signals are typically AC coupled. Using the optical voltage sensor to accurately measure down to direct current (DC)/low frequencies, especially at low level signals has not had much success because the optical sensors are susceptible to changes in the surrounding environment. Temperature, mechanical stresses, and the signal applied to the optical sensor can all cause the optical output signal to shift dramatically. Also, the upstream fiber and laser source to this optical sensor can have significant polarization crosstalk, noise, etc., when subjected to the same mechanical and temperature stresses.

Thus, a need remains for addressing this DC/low-frequency instability/limitation of the sensor, upstream fiber, and laser source.

DETAILED DESCRIPTION

The ability to accurately measure small differential, high bandwidth signals in the presence of large common mode voltages has become a key measurement challenge for users as the edge speeds of a new wave of faster power devices are coming into the market. Wide bandgap devices such as gallium nitride (GaN) and silicon carbide (SiC) devices are poised to displace the traditional silicon (Si) based devices with first generation performance achieving 8-10× faster edge speeds of Si. Given this step function in performance gains, the current test measurement systems simply cannot make these measurements. Implementations of the disclosed technology advantageously enable users to develop a breakthrough measurement solution that addresses these measurement challenges.

Certain implementations of the active noise suppression scheme disclosed herein advantageously enable the use of an optical voltage sensor to measure an electrical signal from DC to GHz by fully compensating for the DC/low-frequency instabilities of the optical voltage sensor, upstream fiber, and laser source. The DC/low frequency output of the optical sensor is susceptible to changes in the environment (such as mechanical and thermal changes, for example) as well as the signal/bias applied. Adding this noise suppression circuitry enables the development of a completely electrically isolated, DC coupled, high bandwidth, high sensitivity (low noise and stable) differential probe with world class common mode rejection and voltage range.

Figure 1:
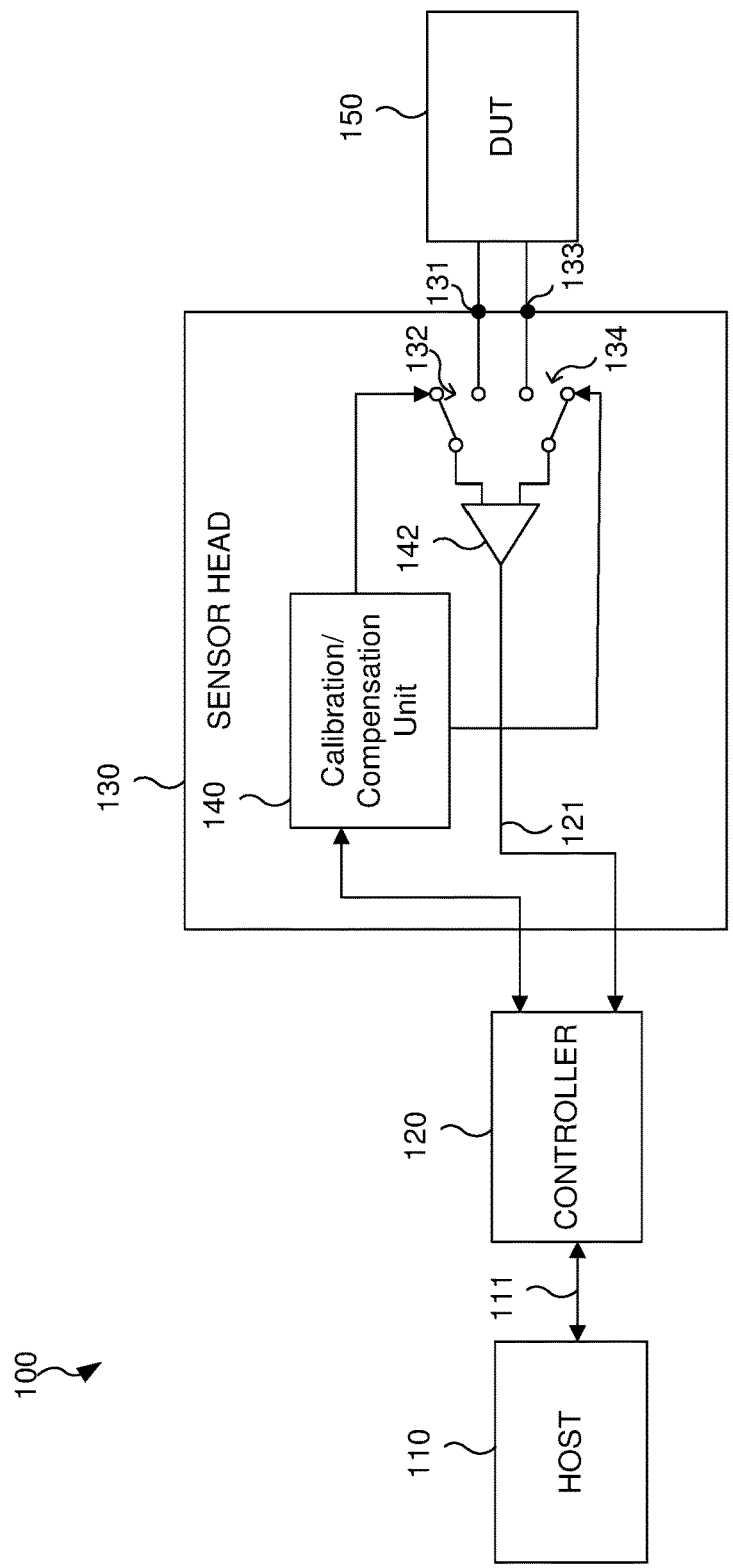
FIG. 1 is a block diagram illustrating a first example of a test measurement system that includes a sensor head.

FIG. 1 is a block diagram illustrating a first example of a test measurement system 100 that includes a host 110, such as an electrical test and measurement instrument, a controller 120, a sensor head 130, and a device under test (DUT) 150. In the example 100, the sensor head 130 includes a calibration/compensation unit 140 and switches 132 and 134.

During a measurement operation mode, a signal from the DUT 150 may be received at inputs 131 and 133 of the sensor head 130. The switches 132 and 134 may be engaged to read the inputs from the DUT 150 and send the signals through an amplifier 142. The measured signal may be sent to the host 110 via the controller 120 through the main signal path 121 and path 111.

The host 110 may be a test and measurement instrument, such as an oscilloscope, logic analyzer, spectrum analyzer, or similar such devices. The connection to the controller 120 of the sensor head 130 may be a wired, optical fiber or a wireless connection as known to one of ordinary skill in the art. It should be noted that, if the DUT 150 and the sensor head 130 are situated at a remote location, it may be necessary to have a wireless connection. Any of the signal paths, e.g., 111 and 121, may be a wired, optical fiber or wireless connection as known to one of ordinary skill in the art.

Figure 2:
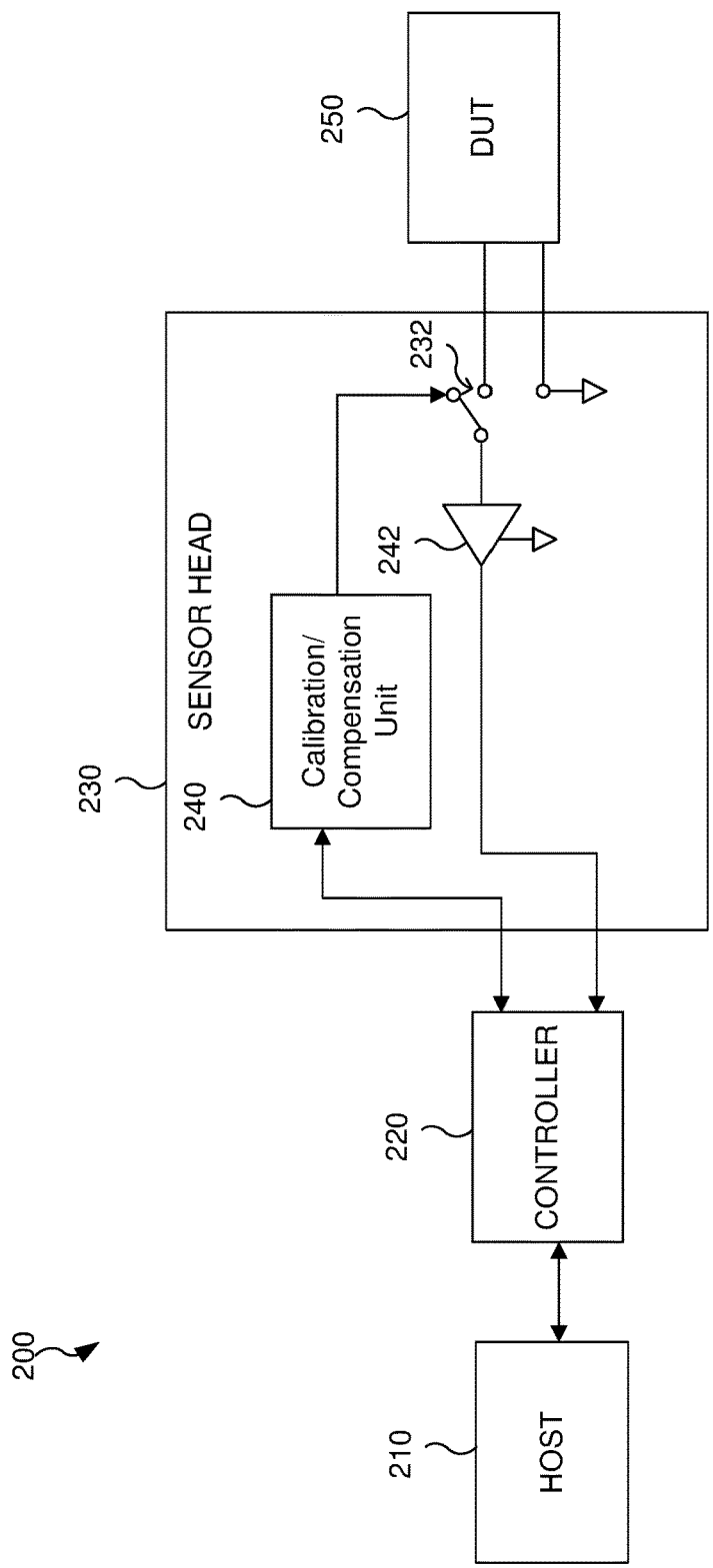
FIG. 2 is a block diagram illustrating a second example of the test measurement system that includes a sensor head.

FIG. 2 is a block diagram illustrating a second example of a test measurement system 200 that includes a host 210, such as an electrical test and measurement instrument, a controller 220, a sensor head 230, and a device under test (DUT) 250. In the example 200, the sensor head 230 includes a calibration/compensation unit 240 and a single switch 232 coupled with an amplifier 242 and configured to switch between the calibration/compensation unit 240 and the signal received from the DUT 250.

Figure 3:
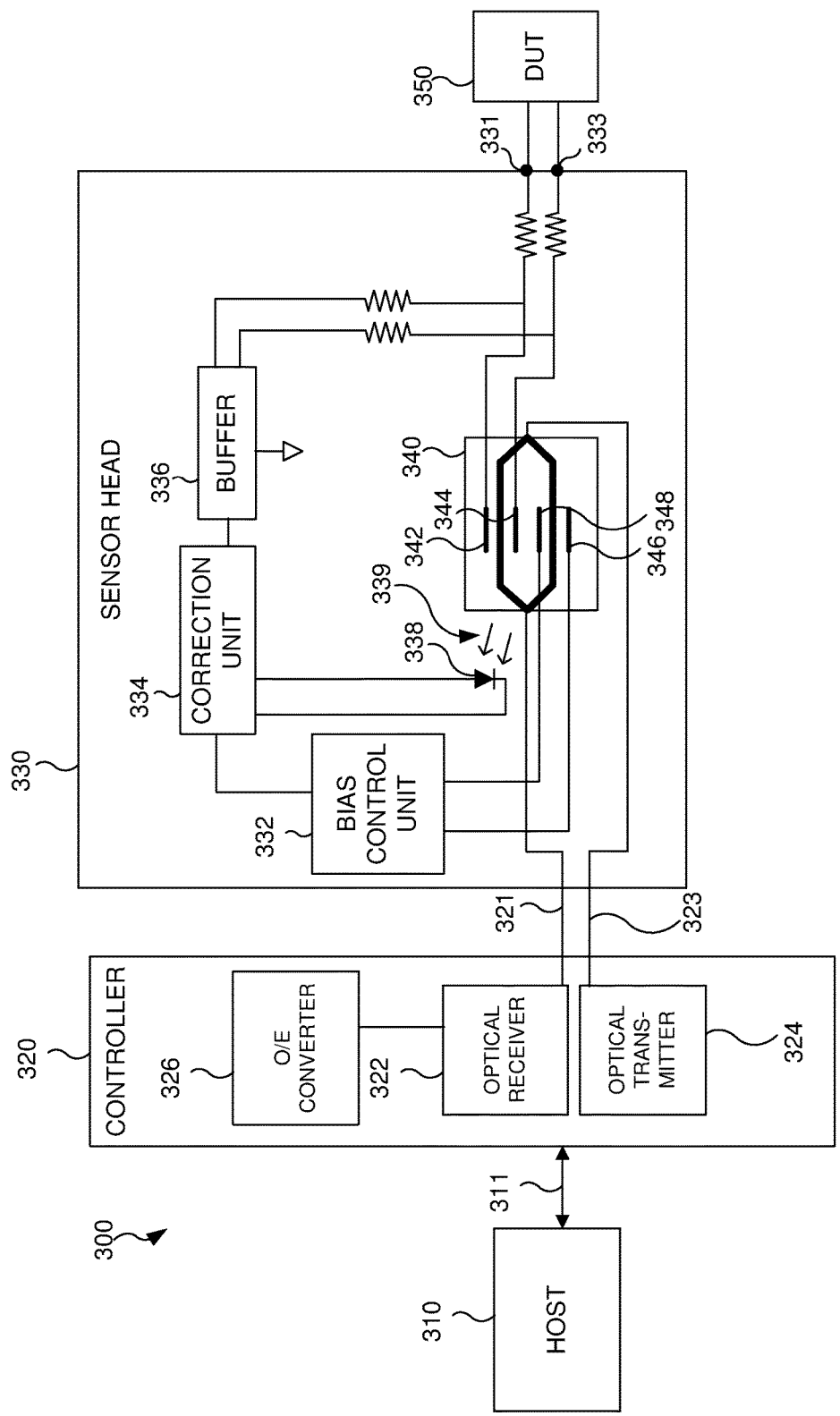
FIG. 3 is a block diagram illustrating an example of a test measurement system that includes an optical voltage sensor and integrated noise suppression architecture in accordance with certain implementations of the disclosed technology.

FIG. 3 is a block diagram illustrating an example of a test measurement system 300 that includes an optical voltage sensor 350 and integrated noise suppression architecture in accordance with certain implementations of the disclosed technology. The system 300 is similar to the systems 100 and 200 illustrated by FIGS. 1 and 2, respectively, in that it includes a host 310, a controller 320, a sensor head 330, and a DUT 350. However, rather than one or more switches coupled with an amplifier, the system 300 includes an optical voltage sensor 340. The optical voltage sensor 340 may be a Mach-Zehnder optical sensor, for example, though other suitable optical sensors may be used in alternative implementations.

The controller 320 also includes an optical transmitter 324, such as a laser source, for example, that is connected to the optical voltage sensor 340 via an upstream fiber 323. The controller 320 further includes an optical receiver block 322 and an optical-to-electrical converter block 326 that may be configured to provide an output signal to the host 310 via connection 311, for example. Also, one or more instructions may be sent from the host 310 to the controller 320 via the connection 311.

Inputs 331 and 333 of the sensor head 330 may be connected to signal input electrodes 342 and 344 of the optical voltage sensor 340. The output from the signal input electrodes 342 and 344 may be sent from the optical voltage sensor 340 to the controller 320 through the main signal path 321, e.g., an output (modulated) signal fiber also referred to herein as a downstream fiber. In the example, the sensor head 330 includes a bias control unit 332 that is connected to a set of control electrodes 346 and 348 of the optical voltage sensor 340. These control electrodes 346 and 348 are separated and also electrically isolated from the signal input electrodes 342 and 344 of the optical voltage sensor 340.

The output of the optical voltage sensor 340 may be sent to the output block 322 of the controller 320 through the main signal path 321. During a measurement operation, the signal from the DUT 350 may be read though the optical voltage sensor 340 from the signal input electrodes 342 and 344.

The illustrated measurement system 300 takes advantage of the superior AC performance of the optical voltage sensor 340 by monitoring and compensating for the DC/low frequency deficiencies of the combination of the upstream fiber 323, the optical voltage sensor 340, and the laser source 324 to provide a stable DC-GHz measurement solution. Integration of the DC/low frequency active noise suppression into the design overcomes this DC/low frequency instability/limitation of the upstream fiber 323, the optical voltage sensor 340, and the laser source 324.

This DC/low frequency noise suppression feedback/correction circuitry generally includes the following three functional portions: a monitoring block, e.g., utilizing a photodiode 338, a correction unit 334, and a resulting bias control unit 332.

The monitoring portion of the measurement system 300 may accurately measure the optical output power 339 of the optical voltage sensor 340 using a photodiode $V_{pd}$ 338 integrated in the optical voltage sensor 340. The monitoring portion may also sample the electrical input signal 331 and 333 from the DUT 350 to the optical voltage sensor 340 and, in certain embodiments, use this signal as the reference signal, $V_{in}$.

These two voltages, $V_{in}$ and $V_{pd}$, may be compared, resulting in a DC/low frequency error signal in the correction block 334. This can generally be performed either digitally, e.g., with an analog-to-digital converter (ADC) or using a hardware control loop.

The resulting error signal from the correction block 334 may be fed back to the bias voltage control block 332, e.g., to null out the error signal. The bias control block 332 output may be applied to the bias electrodes of the optical voltage sensor 340.

In certain embodiments, the monitoring, correction, and bias control functional blocks may continually monitor the $V_{in}$ and $V_{pd}$ voltages and, in certain situations, adjust the bias voltage, e.g., to eliminate or at least minimize the error signal.

This noise suppression scheme overcomes some of the major barriers that have made the optical voltage sensor technology unattractive in a probing test and measurement instrument application.

The disclosed technology is also not limited to use on a voltage probe. The accessory device may be any type of transducer device or general accessory device requiring voltage, current, power, etc., for operation, such as a measurement probe, measurement probe adapter, active filter devices, probe calibration fixture, probe isolation accessory, monitoring equipment, or the like.

Figure 4:
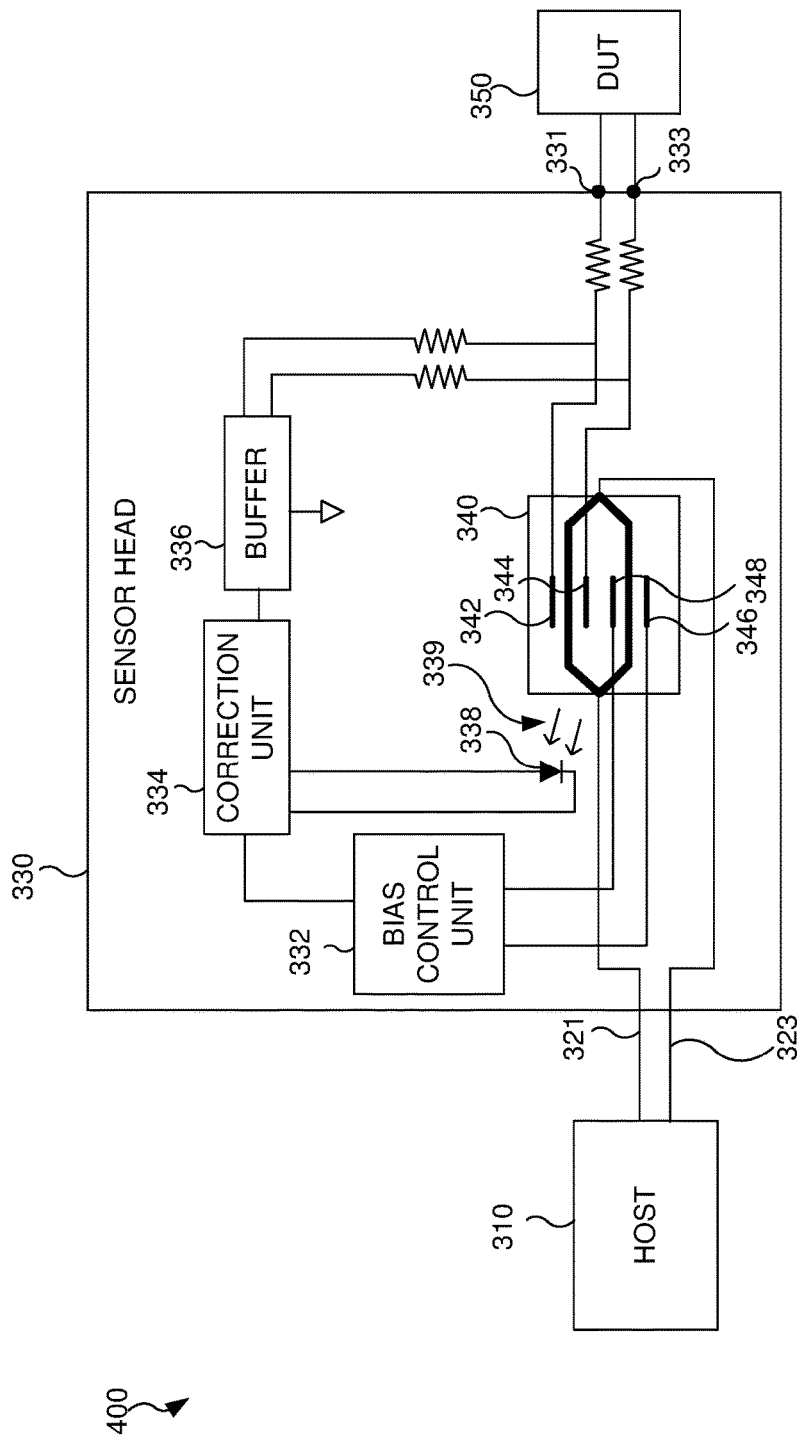
FIG. 4 is a block diagram illustrating an example of a test measurement system that includes an optical voltage sensor and integrated noise suppression architecture in accordance with alternative implementations of the disclosed technology.

FIG. 4 is a block diagram illustrating an example of a test measurement system that includes an optical voltage sensor and integrated noise suppression architecture in accordance with alternative implementations of the disclosed technology. In the example 400, a controller is not required. That is, the host 310 is connected directly to the sensor head 330. In such embodiments, the main signal path 321 is connected directly to the host 310. Further, the output from the sensor head 330 may be sent directly to the host 310, i.e., rather than through a controller.

The term "controller" and "processor" as used herein is intended to include microprocessors, microcomputers, ASICs, and dedicated hardware controllers. One or more aspects of the invention may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other electronic device.

The computer executable instructions may be stored on a non-transitory computer readable medium such as a hard disk, optical disk, removable storage media, solid state memory, RAM, etc. As will be appreciated by one of skill in the art, the functionality of the program modules may be combined or distributed as desired in various embodiments. In addition, the functionality may be embodied in whole or in part in firmware or hardware equivalents such as integrated circuits, field programmable gate arrays (FPGA), and the like. Particular data structures may be used to more effectively implement one or more aspects of the invention, and such data structures are contemplated within the scope of computer executable instructions and computer-usable data described herein.

Having described and illustrated the principles of the disclosed technology in a preferred embodiment thereof, it should be apparent that the disclosed technology can be modified in arrangement and detail without departing from such principles. We claim all modifications and variations coming within the spirit and scope of the following claims.

The invention claimed is:

1. A sensor head of a test and measurement instrument, comprising:
   an input configured to receive an input signal from a device under test (DUT);
   an optical voltage sensor connected to the input;
   a photodiode configured to measure an optical output power $V_{pd}$ of the optical voltage sensor; and
   a bias control unit connected to the optical voltage sensor and configured to reduce an error signal that is based on a voltage of the input signal and the optical output power.

2. The sensor head of claim 1, wherein the bias control unit is configured to eliminate the error signal.

3. The sensor head of claim 1, wherein the optical voltage sensor has signal input electrodes and control electrodes, wherein the input is connected to the signal input electrodes and wherein the bias control unit is connected to the control electrodes; or the optical voltage sensor has one set of electrodes, wherein the input signal is configured to be combined with an error correction signal of the bias control unit and applied to the one set of electrodes.

4. The sensor head of claim 3, further comprising a correction block configured to compare the measured optical output power $V_{pd}$ to a reference signal $V_{in}$.

5. The sensor head of claim 4, wherein the reference signal $V_{in}$ is the input signal.

6. The sensor head of claim 4, wherein the correction block is further configured to identify the error signal based on the comparing.

7. The sensor head of claim 4, further comprising a buffer coupled between the correction block and the input.

8. The sensor head of claim 1, wherein the optical voltage sensor is configured to be coupled with a laser source of an external controller via an upstream fiber.

9. The sensor head of claim 1, wherein the optical voltage sensor is a Mach-Zehnder optical sensor.

10. A measurement system, comprising:
a host;
a controller electrically coupled with the host;
a device under test (DUT);
a sensor head electrically coupled between the controller and the DUT, the sensor head including:
an input configured to receive an input signal from the DUT;
an optical voltage sensor connected to the input
a photodiode configured to measure an optical output power $V_{pd}$ of the optical voltage sensor; and
a bias control unit connected to the optical voltage sensor and configured to reduce an error signal that is based on a voltage of the input signal and the optical output power.

11. The measurement system of claim 10, wherein:
the optical voltage sensor has signal input electrodes and control electrodes, wherein the input is connected to the signal input electrodes and wherein the bias control unit is connected to the control electrodes; or the optical voltage sensor has one set of electrodes, wherein the input signal is configured to be combined with an error correction signal of the bias control unit and applied to the one set of electrodes.

12. The measurement system of claim 9, further comprising a correction block configured to:
compare the measured optical output power $V_{pd}$ to the voltage of the input signal $V_{in}$; and
generate the error signal based on the comparison.

13. The measurement system of claim 12, further comprising a correction block configured to identify the error signal based on the comparing.

14. The measurement system of claim 9, wherein the optical voltage sensor is configured to be coupled with a laser source of the controller via an upstream fiber.

15. The measurement system of claim 9, wherein the optical voltage sensor is a Mach-Zehnder optical sensor.

* * * * *